US009103915B2

(12) United States Patent
Simic et al.

(10) Patent No.: US 9,103,915 B2
(45) Date of Patent: *Aug. 11, 2015

(54) REFERENCE OSCILLATOR MANAGEMENT FOR WIRELESS DEVICES HAVING POSITION DETERMINATION FUNCTIONALITY

(71) Applicant: QUALCOMM Incorporated, San Diego, CA (US)

(72) Inventors: Emilija M. Simic, San Diego, CA (US); Dominic Gerard Farmer, Los Gatos, CA (US); Borislav Ristic, San Diego, CA (US); Ashok Bhatia, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 15 days.
This patent is subject to a terminal disclaimer.

(21) Appl. No.: 13/933,076

(22) Filed: Jul. 1, 2013

(65) Prior Publication Data
US 2013/0295865 A1 Nov. 7, 2013

Related U.S. Application Data

(63) Continuation of application No. 12/486,664, filed on Jun. 17, 2009, now Pat. No. 8,476,982.
(60) Provisional application No. 61/073,731, filed on Jun. 18, 2008.

(51) Int. Cl.
*H03L 7/00* (2006.01)
(Continued)

(52) U.S. Cl.
CPC ............... *G01S 19/45* (2013.01); *H03J 1/0008* (2013.01); *H03J 7/02* (2013.01); *H03L 7/00* (2013.01); *H04B 1/26* (2013.01); *H04B 7/12* (2013.01); *H04B 7/216* (2013.01)

(58) Field of Classification Search
CPC ........... G01S 19/45; H03J 1/0008; H03J 7/02; H03L 7/00; H04B 1/26; H04B 7/12; H04B 7/216

USPC ................. 331/17, 18, 74; 370/320; 455/141, 455/192.1, 196.1, 255, 259, 260, 265, 318, 455/427, 456.1, 552.1
See application file for complete search history.

(56) References Cited

U.S. PATENT DOCUMENTS 5,841,396 A * 11/1998 Krasner .................... 342/357.75
(Continued)

FOREIGN PATENT DOCUMENTS

CN          1143543 A      2/1997
(Continued)

OTHER PUBLICATIONS

International Search Report and Written Opinion—PCT/US2009/047853—ISA/EPO Oct. 13, 2009.
(Continued)

*Primary Examiner* — Levi Gannon
(74) *Attorney, Agent, or Firm* — Howard Seo

(57) ABSTRACT

A method and device for managing a reference oscillator within a wireless device is presented. The method includes selecting reference oscillator parameters associated with the lowest reference oscillator error, where the selection is based upon reference oscillator parameters derived using different technologies within a wireless device, acquiring a satellite based upon the selected reference parameters, determining the quality of the satellite-based position fix, and updating the reference oscillator parameters based upon the quality of the satellite-based position fix. The wireless device includes a wireless communications system, a satellite positioning system (SPS) receiver, a reference oscillator connected to the wireless communications system and SPS receiver, and a mobile controller connected to the reference oscillator, SPS, and wireless communications system, and a memory connected to the mobile controller, where the memory stores a reference oscillator parameter table and instructions causing the mobile controller to execute the aforementioned method.

12 Claims, 7 Drawing Sheets

(51) Int. Cl.
*H04B 1/26* (2006.01)
*H04B 7/12* (2006.01)
*H04B 7/216* (2006.01)
*G01S 19/45* (2010.01)
*H03J 1/00* (2006.01)
*H03J 7/02* (2006.01)

(56) References Cited

U.S. PATENT DOCUMENTS

| | | | |
|---|---|---|---|
| 6,002,363 | A | 12/1999 | Krasner |
| 6,122,506 | A | 9/2000 | Lau et al. |
| 6,249,253 | B1 * | 6/2001 | Nielsen et al. ............ 342/463 |
| 6,424,826 | B1 | 7/2002 | Horton et al. |
| 6,697,016 | B1 * | 2/2004 | Voor et al. ............ 342/357.62 |
| 6,937,872 | B2 | 8/2005 | Krasner |
| 6,965,754 | B2 | 11/2005 | King |
| 7,362,263 | B2 | 4/2008 | McBurney et al. |
| 7,586,382 | B2 | 9/2009 | Wang et al. |
| 7,719,374 | B2 * | 5/2010 | Kuosmanen ............ 331/175 |
| 7,742,785 | B2 | 6/2010 | Harms |
| 8,014,476 | B2 | 9/2011 | Filipovic et al. |
| 8,401,503 | B2 | 3/2013 | Chung et al. |
| 8,476,982 | B2 | 7/2013 | Simic et al. |
| 2004/0142701 | A1 | 7/2004 | Abraham |
| 2004/0214538 | A1 | 10/2004 | Ballantyne et al. |
| 2005/0079846 | A1 | 4/2005 | Sendonaris et al. |
| 2006/0049982 | A1 | 3/2006 | Wells |
| 2007/0205939 | A1 | 9/2007 | Bae |

FOREIGN PATENT DOCUMENTS

| | | |
|---|---|---|
| CN | 1568584 A | 1/2005 |
| KR | 100668910 B1 | 1/2007 |
| RU | 38432 U1 | 6/2004 |
| TW | 463511 B | 11/2001 |
| TW | 546485 B | 8/2003 |
| TW | 200703902 | 1/2007 |
| TW | 200726153 | 7/2007 |
| TW | 200818714 A | 4/2008 |
| WO | 9913595 A1 | 3/1999 |
| WO | 03089952 A2 | 10/2003 |
| WO | 03098258 A1 | 11/2003 |
| WO | 2004065979 A2 | 8/2004 |
| WO | 2005039135 | 4/2005 |

OTHER PUBLICATIONS

Taiwan Search Report—TW098120445—TIPO—Aug. 29, 2012.

* cited by examiner

REFERENCE OSCILLATOR MANAGEMENT FOR WIRELESS DEVICES HAVING POSITION DETERMINATION FUNCTIONALITY

CLAIM OF PRIORITY

The present Application for Patent is a continuation of U.S. patent application Ser. No. 12/486,664 entitled "REFERENCE OSCILLATOR MANAGEMENT FOR WIRELESS DEVICES HAVING POSITION DETERMINATION FUNCTIONALITY" filed on Jun. 17, 2009 and which claims priority to U.S. Provisional Application No. 61/073,731 entitled "LOCAL OSCILLATOR MANAGEMENT FOR WIRELESS DEVICES HAVING POSITION DETERMINATION FUNCTIONALITY" filed Jun. 18, 2008, each of which is assigned to the assignee hereof and hereby expressly incorporated by reference in its entirety herein.

FIELD OF DISCLOSURE

The aspects of the disclosure relate generally to wireless devices which have position determination and/or navigation functionalities, and more specifically, to managing the behavior of a shared reference oscillator utilized by various technologies in a wireless device.

BACKGROUND

Mobile communications networks are in the process of offering increasingly sophisticated capabilities associated with locating the position of a wireless device. New software applications, such as, for example, those related to personal productivity, collaborative communications, social networking, and data acquisition, may utilize geo-location information to provide new features to consumers. Also, some regulatory requirements of a jurisdiction may require a network operator to report the location of a mobile terminal when the mobile terminal places a call to an emergency service, such as a 911 call in the United States.

In a Code Division Multiple Access (CDMA) digital cellular network, the position location capability can be provided by Advanced Forward Link Trilateration (AFLT), a technique that computes the location of the wireless device from the wireless device's measured time of arrival of radio signals from the base stations. A more advanced technique is hybrid position location, where the mobile station may employ a Satellite Positioning System (SPS) receiver where the position is computed based on both AFLT and SPS measurements.

SPS receivers are being incorporated into wireless devices in order to increase the accuracy of wireless device location determination. The SPS receivers can be autonomous and perform all SPS acquisition functions and position calculations (also known as standalone), or they can be non-autonomous (also known as wireless assisted) and rely on other wireless network technologies for providing SPS acquisition data and possibly performing the position calculations.

In wireless devices having both a wireless communications system and an SPS, it may become cost effective to share system components which can be used by both systems. For example, such systems may share a reference oscillator, such as tunable reference oscillator and/or a free-running reference oscillator for providing reference frequencies. Sharing such components can reduce cost, complexity, size, weight, and power consumption.

However, sharing components may involve some compromises in performance and/or functionality to reduce operation complexity. For example, current wireless devices may allow shared frequency management based only upon the communications system's performance, but not specifically for the SPS's performance.

Position determination accuracy of a wireless communication device may be negatively affected by frequency biases, which in turn may affect SPS Doppler estimations and SPS Doppler measurements conducted by the wireless device. Large unaccounted frequency biases can prevent the wireless device from acquiring satellites. Large unaccounted frequency biases may also result in poor quality SPS Doppler measurements which can also adversely affects position accuracy, because of the adverse effect on the SPS code phase measurement determination.

A major contributor to the complexity associated with searching and acquiring the satellite signal is the frequency error attributable to the receiver Local Oscillator (LO). The LO is used in the receiver to down convert the received signal to a baseband signal. The baseband signal is then processed. In the case of a signal received from a SPS satellite, the baseband signal is correlated to all possible pseudo random codes to determine which satellite transmitted the signal, and to determine the time of arrival of the signal. The search and acquisition process is greatly complicated by the LO frequency error. Any frequency error contributed by the LO creates additional search space that typically should be covered. Furthermore, the LO frequency error presents a separate dimension over which time of arrival may be searched. Thus, the search space is increased in proportion to the frequency error, since the time of arrival search may be conducted over all possible frequency errors. Many parameters contribute to real or perceived LO frequency error. The circuit operating temperature as well as the temperature gradient across the circuit board affects the LO frequency. Additionally, the frequency stability of the reference oscillator used to generate an LO contributes directly to the LO frequency stability.

Accordingly, it would be beneficial to employ a unified frequency management approach for reducing the LO frequency error to reduce the search space covered in baseband signal processing. Reduction in the search space allows for lower search complexity, which in turn allows for greater receiver sensitivity and decreased search and acquisition times.

SUMMARY

Exemplary aspects of the invention are directed to apparatuses and methods for reference oscillator management for wireless devices having position determination functionality. In one aspect of the disclosure, the method includes selecting reference oscillator parameters associated with the lowest reference oscillator error, where the selection is based upon reference oscillator parameters derived using different technologies within the wireless device. The method further includes acquiring a satellite based upon the selected reference oscillator parameters and calculating a satellite-based position fix. The method further includes determining the quality of the satellite-based position fix, and updating the reference oscillator parameters based upon the quality of the satellite-based position fix.

In another aspect the reference oscillator may be tunable reference oscillator, such as Voltage Controlled Temperature Compensated Crystal Oscillator (VCTCXO) or Voltage Controlled Crystal Oscillator (VCXO) or free-running oscillator, such as temperature Compensated Crystal oscillator (TCXO) or Crystal Oscillator (XO).

In another aspect of the disclosure, a wireless device having position determination functionality which manages a reference oscillator using a plurality of technologies is presented. The wireless device may include a wireless communications system, a satellite positioning system (SPS) receiver, a reference oscillator connected to the wireless communications system and SPS receiver. The device may further include a mobile controller connected to the reference oscillator, the SPS, and the wireless communications system. The device may further include a memory connected to the mobile controller, wherein the memory stores a reference oscillator parameter table and instructions causing the mobile controller to: select reference oscillator parameters associated with the lowest reference oscillator error, wherein the selection is based upon reference oscillator parameters derived using different technologies within a wireless device, acquire a satellite based upon the selected reference oscillator parameters, calculate a satellite-based position fix, determine the quality of the satellite-based position fix, and update the LO parameters based upon the quality of the satellite-based position fix.

BRIEF DESCRIPTION OF THE DRAWINGS

The accompanying drawings are presented to aid in the description of aspects of the invention, and are provided solely for illustration of these aspects and not the limitation thereof.

DETAILED DESCRIPTION

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Figure 1:
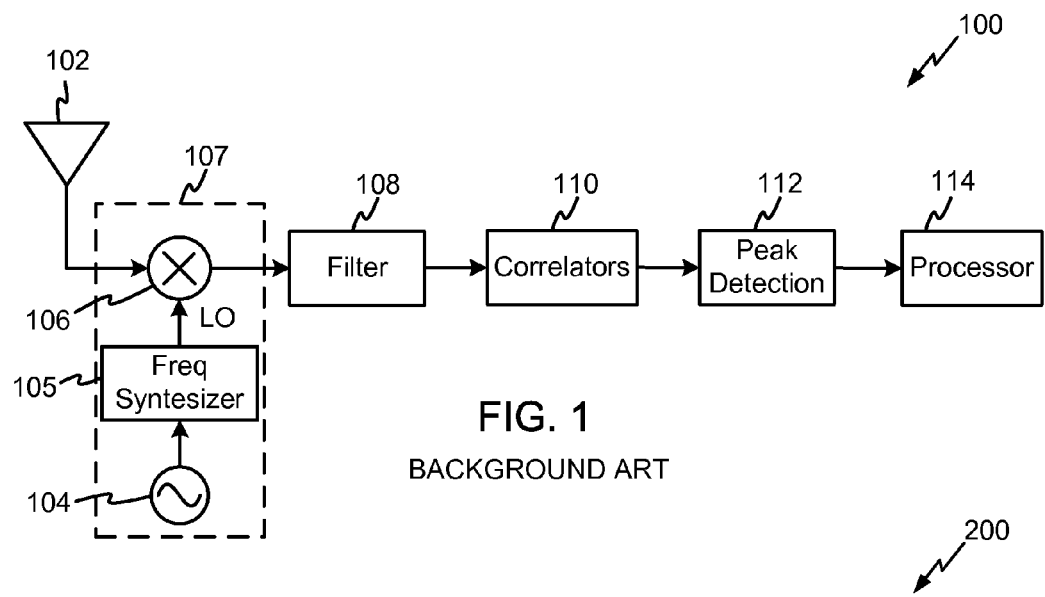
FIG. 1 is a top level block diagram of an exemplary SPS receiver.

FIG. 1 is a top level block diagram of an exemplary Satellite Positioning System (SPS) receiver showing only the basic functional components to simplify the discussion. The antenna 102 may serve as the interface between broadcast signals and the receiver 100. The antenna 102 may be tuned to optimally receive signals transmitted in the L-Band where the receiver 100 is configured as a SPS receiver. In the case of a SPS receiver, the source of the broadcast signals can be a constellation of SPS satellites orbiting the earth.

As used herein, the term "Satellite Positioning System" may encompass a Global Positioning System (GPS), the European Galileo system, the Russian GLONASS system, NAVSTAR, GNSS, a system that uses satellites from a combination of these systems, or any other current satellite positioning systems or any SPS which may be developed in the future. Additionally, the term "Satellite Positioning System" may also include pseudolite positioning systems, or systems using a combination of pseudolites and satellites. Pseudolites may be defined as ground based transmitters that broadcast a PN code or other ranging code (similar to GPS or CDMA cellular signals modulated on a carrier signal.

The SPS signals received by the antenna 102 may be coupled to a down converter 107. The down converter 107 serves to down convert the RF signals received by the antenna 102 to baseband signals that are further processed. The main components of the down converter 107 are the mixer 106 and the Local Oscillator (LO) signal generated with frequency synthesizer 105 from reference oscillator 104. The received signal is coupled from the antenna 102 to the mixer 106 within the down converter 107. Any filtering or amplification of the signal within the down converter 107 is not shown in order to simplify the block diagram to its functional components. The mixer 106 acts to effectively multiply the received signal with the LO signal generated with frequency synthesizer 105 from reference oscillator 104. The resultant signal output from the mixer 106 is centered at two primary frequencies. One frequency component of the mixer 106 output is centered at the sum of the received signal center frequency and the LO operating frequency. The second frequency component of the mixer 106 output is centered at the difference between the received signal center frequency and the LO operating frequency. The output of the down converter 107 may be coupled to a filter 108 to remove the undesired frequency component from the mixer 106 and to precondition the down converted signal prior to subsequent signal processing.

The filtered signal may be coupled to a bank of correlators 110. The correlators 110 utilize digital signal processing techniques to process the filtered signals. The correlators digitize the signal using Analog to Digital Converters (ADC) to permit digital signal processing. The correlators 110 may be used to determine the code phase offset of the received satellite signals when the receiver 100 is configured for SPS position determination. The receiver 100 may have no prior knowledge as to its position when it is initially powered up. The receiver 100 determines its initial position by searching through all the possible pseudo-random number (PN) code sequences transmitted by each satellite. Additionally, the receiver 100 may search through all of the possible phases of all possible PN codes. The search may be performed by a number of correlators operating in parallel to reduce the search time used by the receiver 100. Each correlator operates on a single PN sequence. The correlator attempts to determine the phase offset of an internally generated PN code to the code received from the satellite. PN codes that do not correspond to the satellite signal may have no significant correlation because of the random nature of the PN codes. Additionally, the correct PN code may have no significant correlation with the received signal unless the phases of the two code signals are aligned. Thus, the correlators 110 may only provide an indication of correlation in the correlator having the same pseudo random code as the received signal when the code phases of the two signals are aligned.

The correlator results may then be coupled to a peak detection 112 processor. The many correlators operate in parallel and simultaneously provide results to the peak detection 112 processor which may determine the most likely pseudo random codes and code phase offsets for the received signal.

The SPS utilizes orthogonal codes for each of the satellites. This allows all of the satellites to simultaneously transmit at the same frequency. The receiver is thus simultaneously presented information from multiple sources. The multiple correlators 110 operate independently of each other and can determine the phase of a received PN code in the presence of other orthogonal codes. Therefore, the peak detection 112 processor is simultaneously provided correlation numbers identifying a number of PN codes and the phase offset for those codes. Since each satellite is assigned a PN code, the identification of a pseudo random code identifies a particular satellite as its source. Additionally, the determination of the code phase offset determines the time of arrival of that signal. The processor 114 analyzes the information in the peak detection 112 processor to calculate the receiver's position. The simultaneous determination of the PN code and code phase offsets allows the processor 114 to make an estimate of receiver position as the peak detection 112 processor is updated.

However, the search process is complicated if the LO frequency within the down converter 107 is inaccurate. An additional contributor to frequency error is the Doppler shift contribution attributable to the velocity of the receiver. Even in the situation where the receiver LO is perfectly accurate there may be a perceived frequency error due to the Doppler shift contribution. The shift may cause either an apparent increase or an apparent decrease in the frequency of the satellite transmission. Although both the satellite and the receiver LO may be perfectly stable, the signal at the receiver appears to have shifted in frequency. If the Doppler shift contributed by the movement of the receiver is not corrected within the receiver, it can contribute to any frequency error already present in the receiver.

Figure 2:
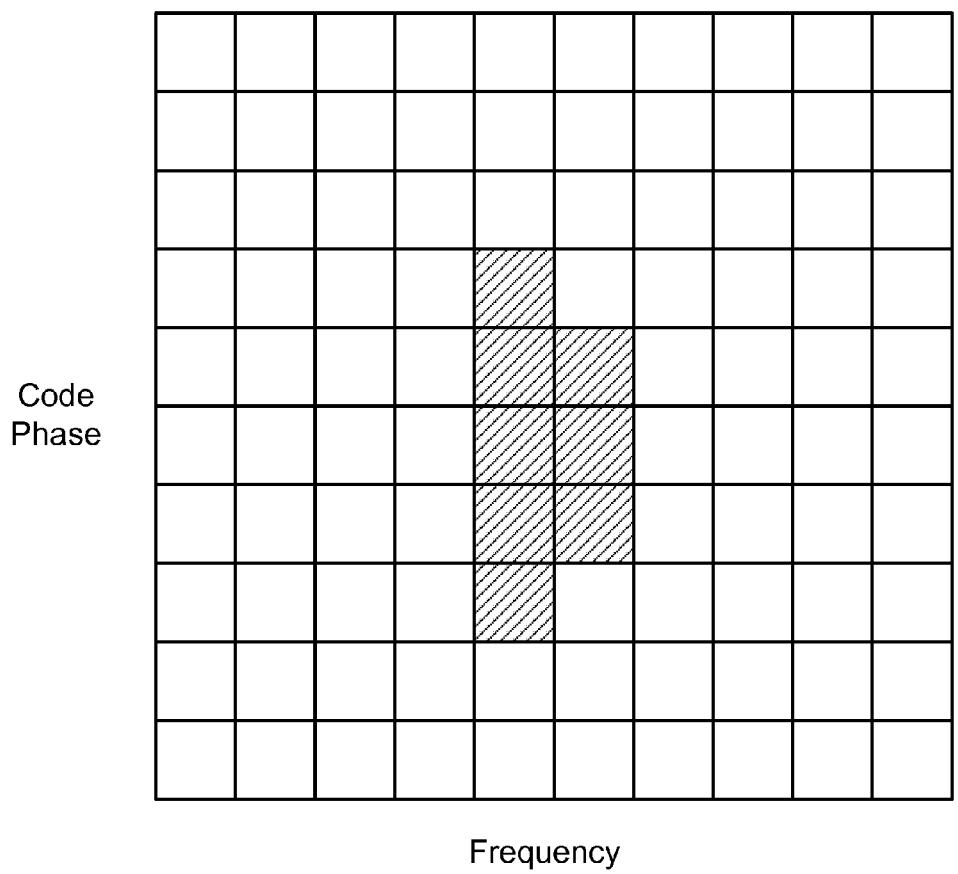
FIG. 2 is a diagram representing an exemplary code phase/frequency space searched by a SPS receiver to acquire a satellite.

FIG. 2 is a diagram representing an exemplary PN code phase/frequency space searched 200 by a SPS receiver to acquire a satellite. Errors in the frequency accuracy of the LO complicate the search process. Each correlator in a SPS receiver may search through all code phase possibilities. The code phase search space is shown as the vertical search space in FIG. 2. Each bin in the code phase search space represents the smallest discernable code phase difference. The short pseudo random code length used for SPS may be 1023 bits long. Therefore, at least 1023 bins may be used in the code phase search space to uniquely identify the phase of the pseudo random code.

It can be seen from FIG. 2 that an increase in the frequency search space proportionally increases the complete search space 200. The frequency search space represents an additional search dimension since the frequency error may be mutually exclusive of any code phase error. In one aspect, each bin in the frequency search space can represent the minimum discernable frequency span. The size of the minimum discernable frequency span is a function of the number of the total coherent integration time. The minimum discernable frequency span decreases as the total coherent integration time increases. Additionally, a sufficient number of frequency bins are used to achieve a desired frequency search space. An increase in the unaccounted for LO bias and/or drift typically necessitates an increased frequency search space.

The receiver correlates samples within each bin defined in the complete search space 200. Successive results are accumulated to further improve the Signal to Noise Ratio (SNR) of the received signal. LO drift causes the results of the accumulation to appear in a number of bins corresponding to the frequency drift. This "smearing" of the signal is shown in FIG. 2 as shading in a number of the frequency bins. An LO which exhibits no drift enables the results of the accumulation to appear in one single frequency bin. This can greatly improve signal identification through increased SNR.

Errors in the frequency accuracy of the LO that are expected to dominate all others are the LO errors due to the shared reference oscillator frequency instability. These errors will be common to all wireless communication system(s) and SPS system(s) in a wireless device that share the reference oscillator In various aspects of the disclosure, apparatuses and methods are presented to provide a unified approach to effectively manage local oscillator frequency errors via effectively managing reference oscillator frequency biases, aging effects, and uncertainties for position determination systems used in wireless communication devices. These approaches may store various oscillator parameters associated with the position determination system in non-volatile memory. These parameters can be updated and improved with successive satellite acquisitions and successful position location fixes, and be used later to reduce the time used for subsequent satellite acquisitions and position location fixes each time the SPS is initialized. In some aspects, these saved parameters may be used in software to alter the frequency search window. In other aspects, these parameters may be used to tune the wireless device's reference oscillator directly, which may obviate the need to alter the frequency search window in software. In other aspects, apparatuses and methods are presented to provide an approach to effectively manage local oscillator frequency errors via managing reference oscillator frequency biases, aging effects and/or uncertainties for standalone position determination systems, such as, for example, standalone GNSS receivers, standalone PND devices, etc.

Figure 3:
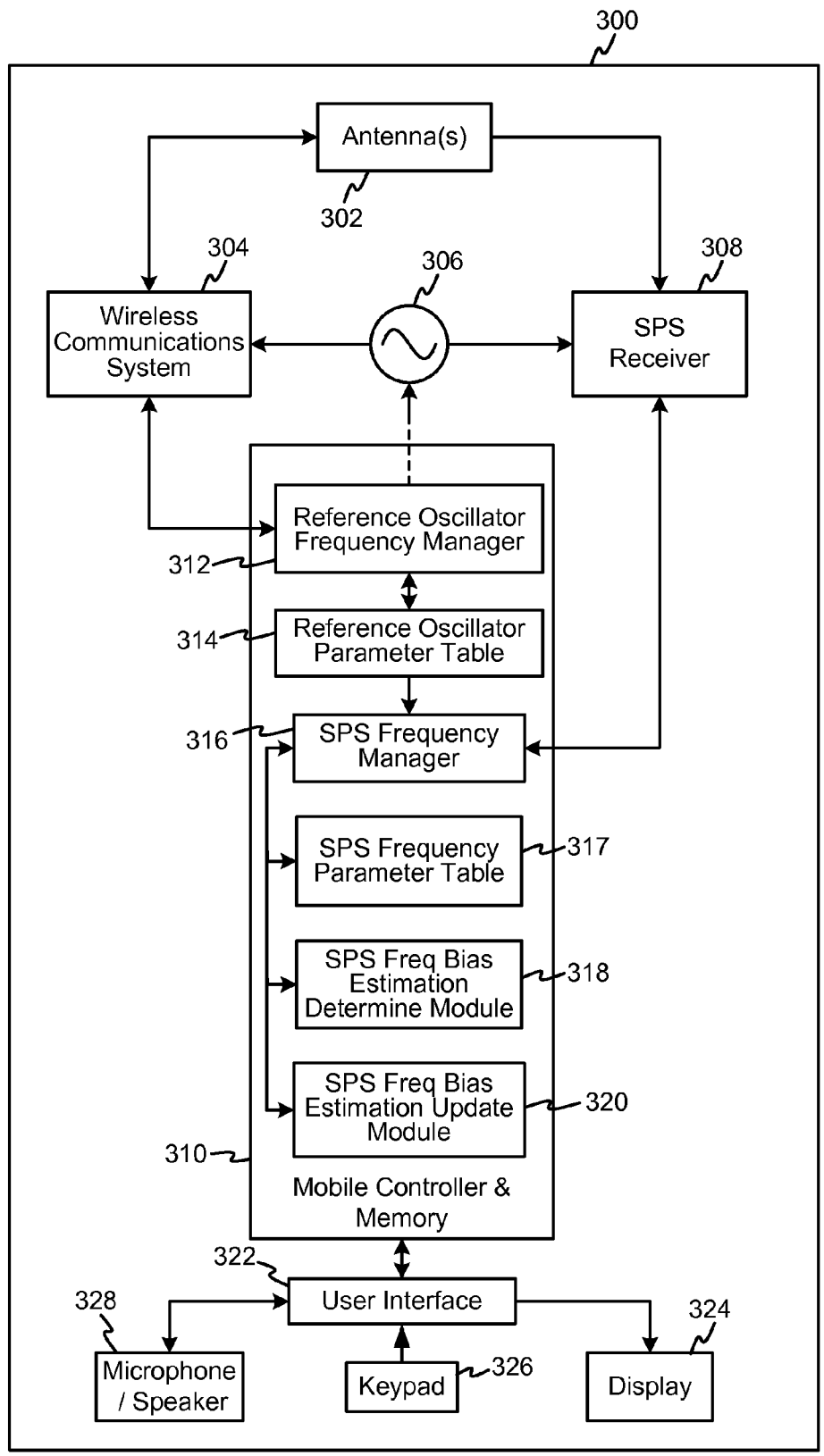
FIG. 3 is a block diagram of an exemplary wireless communications and position device which utilizes passive frequency bias correction for an SPS receiver.

FIG. 3 is a block diagram of an exemplary wireless device 300 which includes a wireless communications system and position determination system using passive frequency bias correction for a Satellite Positioning System (SPS) receiver.

As used herein, the term "wireless device" may refer to any type of wireless communication device which may transfer information over a network and also have position determination and/or navigation functionality. The wireless device may be any cellular mobile terminal, personal communication system (PCS) device, personal navigation device, laptop, personal digital assistant, or any other suitable mobile device capable of receiving and processing network and/or SPS signals.

Moreover, as used herein, the term "network" may refer to any wireless communication network, including a wireless wide area network (WWAN), a wireless local area network (WLAN), a wireless personal area network (WPAN), and so on. A WWAN may be a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, and so on. A CDMA network may implement one or more Radio Access Technologies (RATs) such as cdma2000, Wideband-CDMA (W-CDMA), and so on. Cdma2000 includes IS-95, IS-2000, IS-2000 EV-DO and IS-856 standards. A TDMA network may implement Global System for Mobile Communications (GSM), Digital Advanced Mobile Phone System (D-AMPS), or some other RAT. GSM and W-CDMA are described in documents from a consortium named "3rd Generation Partnership Project" (3GPP). Cdma2000 is described in documents from a consortium named "3rd Generation Partnership Project 2" (3GPP2). 3GPP and 3GPP2 documents are publicly available. A WLAN may be an IEEE 802.11x network, and a WPAN may be a Bluetooth network, an IEEE 802.15x, or some other type of network. The techniques may also be used for any combination of WWAN, WLAN and/or WPAN.

Finally, as used herein, the term "passive" corrections may refer to frequency bias corrections which are not directly applied to tune (or "discipline") the shared reference oscillator. Instead, in a passive correction mode, such corrections may be applied in other portions of the system which may be downstream from where the LO derived from a reference oscillator is utilized. In the aspect shown in FIG. 3, the corrections may be applied in software after the LO has been used to down-convert the received RF signal. Such passive corrections may have the advantage of reducing the impact of implementing the corrections in existing wireless devices.

The wireless device 300 may include a wireless communication system 304 that may be connected to one or more antennas 302. The wireless communication system 304 comprises suitable devices, hardware, and/or software for communicating with and/or detecting signals to/from wireless base stations, and/or directly with other wireless devices within a network. The wireless communications system may include transmitter/receiver modules which utilize an external shared reference oscillator 306 to generate a local oscillator signal (LO) that enables accurate up-conversion/down-conversion (e.g., frequency translation) for the transmitted/received communication signals.

In one aspect, the wireless communication system 304 may comprise a CDMA communication system suitable for communicating with a CDMA network of wireless base stations; however in other aspects, the wireless communication system may comprise another type of cellular telephony network, such as, for example, TDMA or GSM. Additionally, any other type of wireless networking technologies may be used, for example, Wi-Fi (802.11x), WiMax, etc.

A mobile control system (MC) 310 may be connected to the wireless communication system 304, and may include a microprocessor that provides standard processing functions, as well as other calculation and control functionality. The MC 310 may also include on-board memory for storing data and software instructions for executing programmed functionality within the wireless device 300. The MC 310 may further utilize external memory (not shown) for additional storage. The details of software functionality associated with aspects of the disclosure will be discussed in more detail below.

A position determination system may be provided within the wireless device 300. In one aspect, the position determination system may include an SPS receiver 308. The SPS receiver 308 may be connected to the one or more antennas 302, the MC 310, and the reference oscillator 306, and comprise any suitable hardware and/or software for receiving and processing SPS signals. The SPS receiver 308 requests information and operations as appropriate from the other systems, and performs the calculations necessary to determine the wireless device's position using measurements obtained by any suitable AFLT algorithm, SPS algorithm, or a combination of AFLT and SPS algorithms (A-SPS).

The SPS receiver 308 may utilize the same reference oscillator 306 for processing received SPS signals as is used for processing signals for the wireless communications system 304. Having a shared reference oscillator may provide the advantages of increased power efficiency and reduced cost of the wireless device 300. To accommodate each system within a wireless device 300 which may have differing frequency requirements, each system may generate its own local oscillator (LO) signal at the required frequency from the shared reference oscillator 306. As an example, for simultaneous reception of the SPS signal and reception/transmission of wireless communication signals, the SPS receiver 308 and the wireless communication system 304 may employ separate frequency synthesizers for the generation of different frequency local oscillators signals (LOs), as required for each system.

The reference oscillator 306 may be a tunable reference oscillator, such as Voltage Controlled Crystal Oscillator (VCCO) or Voltage Controlled Temperature Compensated Crystal Oscillator (VCTCXO), where the frequency of oscillation may be controlled by a voltage, or, as in this aspect, a digital voltage control value. Moreover, undesirable variations in oscillation frequency due to temperature (and/or other error sources) may be directly compensated via tuning the reference oscillator to improve accuracy. Such errors and their associated compensations are described in more detail below. In another aspect, the reference oscillator 306 may be a free running local oscillator, such as a Crystal Oscillator (XO) or a Temperature Compensated Crystal Oscillator (TCXO). Undesirable variations in oscillation frequency due to temperature (and/or other error sources) may be compensated via corrections applied in each individual system on board of a wireless device, such as SPS receiver 308 and/or wireless communication system(s) 304, downstream from each system's LO, A user interface 322 includes any suitable interface systems, such as a microphone/speaker 328, keypad 326, and display 324 that allows user interaction with the mobile device 300. The microphone/speaker 328 provides for voice communication services using the wireless communication system 304. The keypad 326 comprises any suitable buttons for user input. The display 324 comprises any suitable display, such as, for example, a backlit LCD display.

A number of software modules and data tables may reside in memory and be utilized by the MC 310 in order to manage the errors and biases in the reference oscillator when either the wireless communications system 304 or the SPS receiver 308 is initialized. For the wireless communications system, a reference oscillator frequency manager 312 may be used to provide a variety of frequency bias/errors estimates, which may be based upon the previous state of the system, the temperature, and/or the age of the reference oscillator. These estimates may typically have different accuracies, which may be measured in parts-per-million (ppm); both the frequency biases/errors and associated uncertainties can be stored in a reference oscillator frequency parameter table 314. When the wireless communication system is initialized, the reference oscillator frequency manager 312 may select the frequency bias estimate which has the lowest associated error from reference oscillator frequency parameter table 314. In an aspect where the reference oscillator 306 is tunable this frequency bias estimate may then used to directly tune the reference oscillator 306 so it may properly acquire and receive/transmit signals for the wireless communication system. In another aspect where the reference oscillator 306 is free running, the frequency bias estimate from reference oscillator frequency parameter table 314 may be used elsewhere in the wireless communication systems to properly modulate/demodulate signals. For example, the reference oscillator frequency manager (312) may utilize these items to set the initial frequency window center and width for wireless communication signal acquisition.

The frequency bias estimate values which are stored in the reference oscillator parameter table 314 may include hard coded defaults provided by manufacturers when the reference oscillator is made to specify the "goodness" of the reference oscillator used; values pushed to the device from the network provider (which may vary in accuracy depending upon the type of network, e.g., CDMA, WCDMA, GSM, 1x, 1xEVDO); values based upon the measured temperature and/or age of the reference oscillator, and values based upon a Recent Good System value (RGS) derived after the wireless communication system locks onto a provider's carrier frequency. The RGS value may be refined and stored because, during operation, the wireless communication system 304 may use frequency tracking loops to determine shifts in carrier frequency. Newer values may be stored as the Recent Good System value in the reference oscillator parameter table 314.

During initialization of the SPS receiver, the SPS Frequency Manager 316 may obtain the frequency bias estimates which have the lowest associated error from both reference oscillator parameter table (314) and SPS frequency parameter table (317) and utilize these items to acquire satellites. For example, the SPS frequency manager (316) may utilize these items to set the initial frequency window center and width for satellite acquisition. Once the SPS receiver is initialized, the SPS Frequency Manager 316 can determine at least one SPS frequency bias value associated with the last good satellite-based position fix. This value may then be stored in an SPS frequency parameter table 317 and used for a subsequent initialization in the absence of better quality (e.g. smaller uncertainty) frequency bias estimates from reference oscillator parameter table (314). Because of the stored last good fix information, the time period to acquire the satellite and obtain the position fix on the subsequent initialization may be reduced. The aspect shown in FIG. 3 is passive from SPS receiver standpoint and the stored SPS frequency bias value(s) may be used to compute a center and a width for the window used to search for the center frequency of the SPS signal, which is used by the SPS receiver 308. In this aspect, the stored bias values from SPS frequency parameter table (317) are not used by the reference oscillator frequency manager (312) to discipline the reference oscillator 306. In addition, the bias values stored in SPS frequency parameter table 317 are not used by reference oscillator manager 312 to otherwise correct reference oscillator errors to assist in the modulation/demodulation of wireless communication signals. In addition, in this aspect, only the SPS receiver is utilizing this frequency information; no other system on the phone (e.g., any wireless communication system) is using this information.

The SPS Frequency manager includes software modules to determine the SPS frequency bias estimate (318), and to update the SPS bias estimation (320) for storage in the SPS frequency parameter table 317. These software modules will be described in detail below using the flowcharts shown in FIGS. 5 and 6.

The software and SPS reference oscillator frequency bias value(s) may be stored in non-volatile memory which can be on-board the MC 310, however, in other aspects, this memory may reside on a separate chip package. In addition to the SPS frequency bias estimate, other parameters such as the frequency uncertainty may be used to compute the frequency search window center and/or width. The stored items may be used together with simple algorithms for updating the values in the SPS freq. parameter table 317, for subsequent use by the MC 310.

As will be described in other aspects (shown in FIGS. 7 through 8) the information determined for the SPS may benefit other technologies used in the wireless communication system, as well as be useful for improved navigation satellite acquisition times.

While only one wireless communication system 304 is shown in FIG. 3, one will appreciate that more than one wireless communication systems may be used in other aspects of the invention. For example, with multi-mode wireless devices, different wireless communication systems (e.g., CDMA, TDMA, Wi-Fi, etc.) may be present in the wireless device in order to access a variety of different networks. Depending upon the wireless device and the networks, these different wireless communication systems may operate separately from each other, or may operate simultaneously.

Moreover, while only one SPS 308 is shown in FIG. 3, one will appreciate that more than one SPS 308 may be used in the wireless device 300 in other aspects of the invention to perform location and/or navigation functionality.

Figure 4:
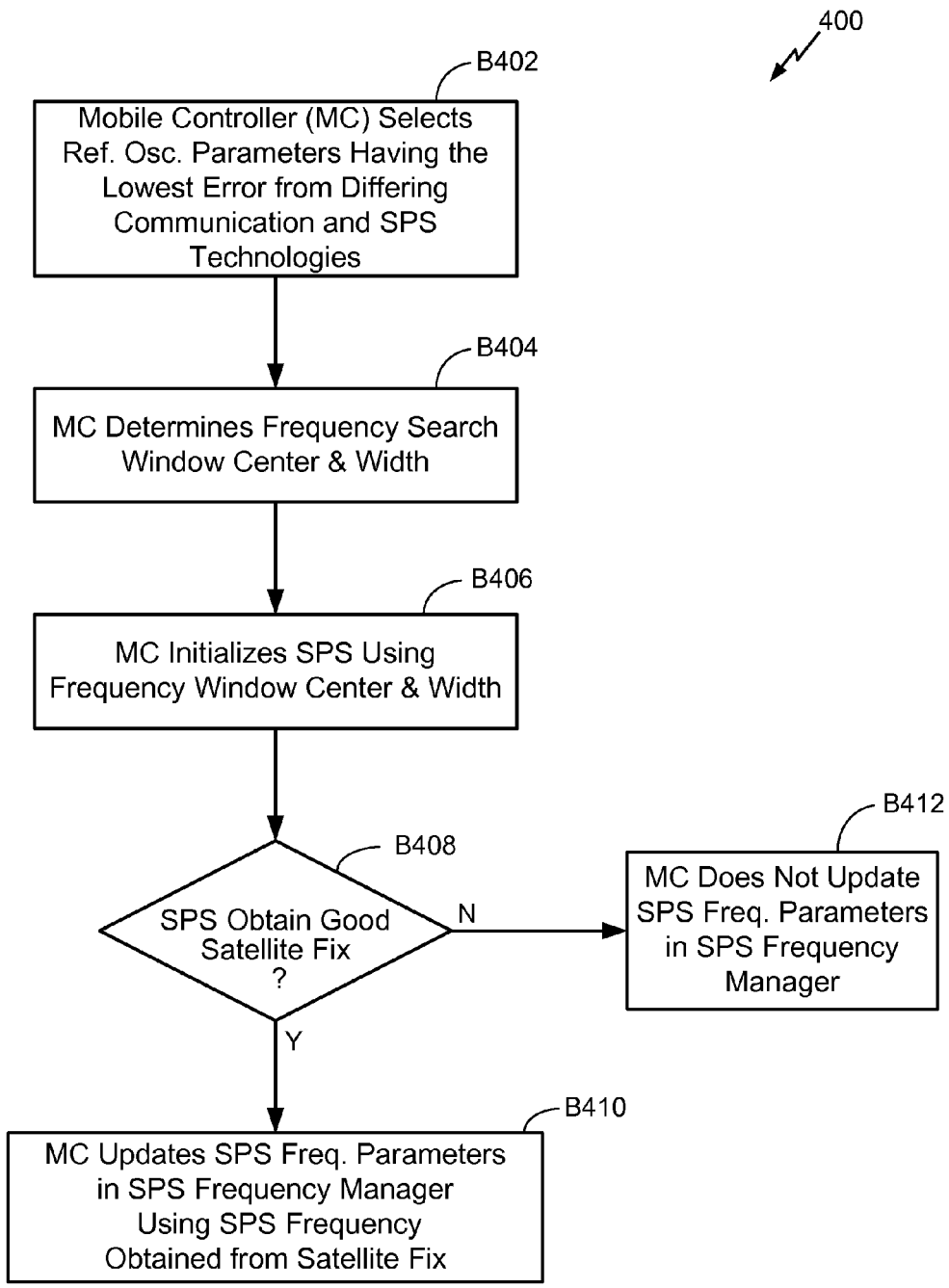
FIG. 4 is a top level flow chart illustrating an exemplary process for performing passive frequency bias correction for an SPS receiver.

FIG. 4 is a top level flow chart illustrating an exemplary method 400 for performing passive frequency bias correction of SPS receiver. Initially, the method may start out by having the mobile controller (MC) 310 select reference oscillator parameters having the lowest error from the differing technologies (Block 402). These parameters may include the frequency biases and uncertainties which may be stored in the reference oscillator parameter table 314 and/or SPS frequency parameter table 317. At this point, the frequency bias parameter may have originated using technologies associated with the wireless communication system 304, or the SPS receiver 308. Once the best frequency bias and uncertainty are read from the reference oscillator parameter table 314 or SPS freq. parameter table 317, the MC 310 may use these values to determine the center and width of the SPS frequency window which is used to search for the SPS signal (B404). These center and width of the search window are provided by the MC 310 to the SPS receiver 308 to initialize the acquisition processes (B406). A determination may then be made to test whether the SPS receiver 308 obtains a good satellite fix (B408). If no satellite signal was acquired, then the MC 308 does not update the SPS frequency bias values and/or uncertainties in the SPS freq. parameter table 317 (B412). If the SPS receiver 308 acquires a good satellite fix, then the MC 310 may update the SPS frequency bias and/or uncertainty using the SPS frequency manager 316 (B410). Details of how the frequency updates are performed and are subsequently used are presented below in the description of FIGS. 5 and 6, respectively.

Accordingly, because the frequency bias values are updated based upon the last good satellite fix, the aforementioned method may be defined as an adaptive technique for SPS local oscillator management. This technique can enable the proper biasing of the initial SPS frequency search space and further reduce the initial SPS frequency uncertainties in the absence of any better reference oscillator manager information from any other wireless technology. This technique can also enable the proper biasing of the initial SPS frequency search space and further reduce the initial SPS frequency uncertainties in standalone position determination devices, such as standalone GNSS receivers, standalone PND devices, etc.

Figure 5:
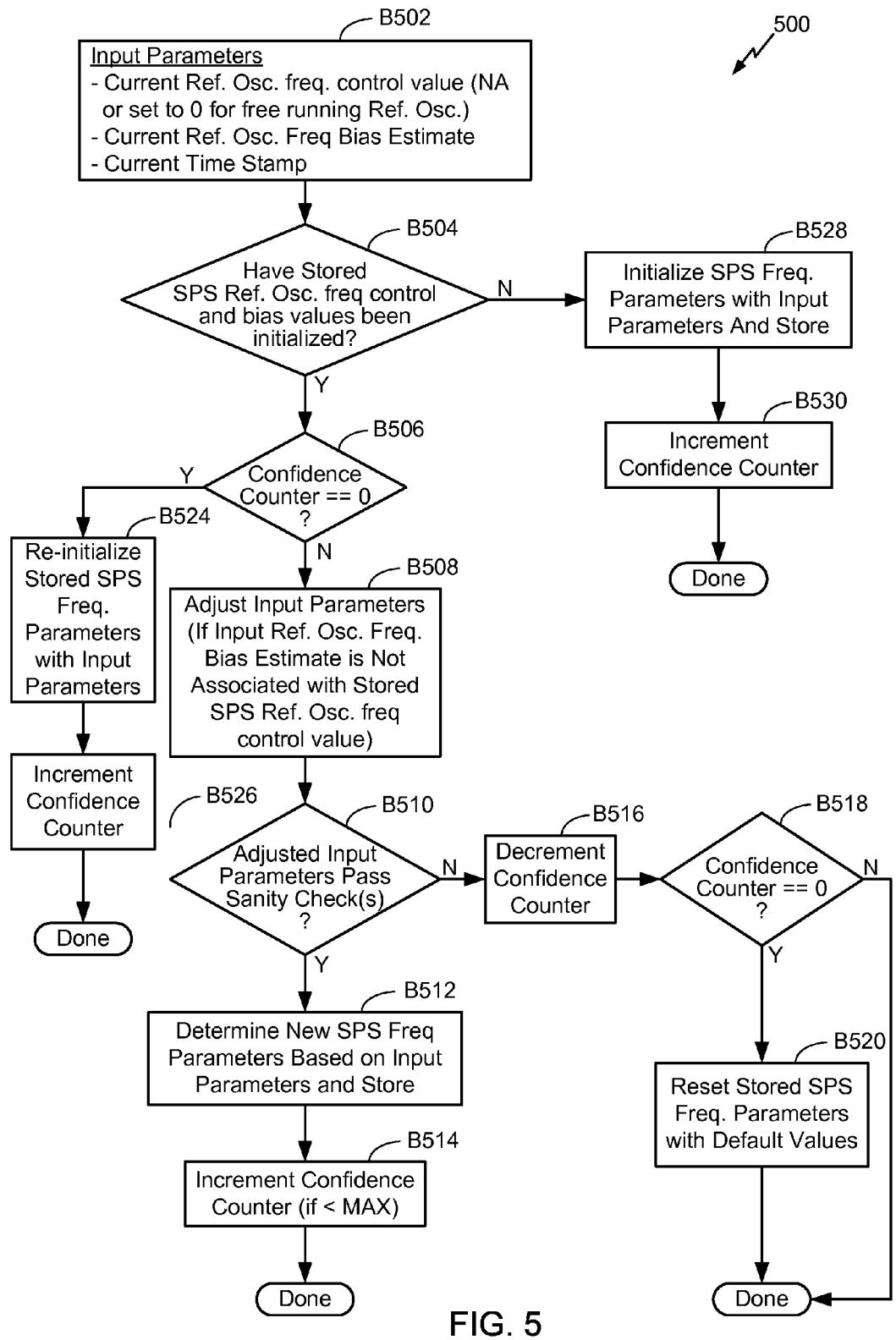
FIG. 5 is a flow chart illustrating an exemplary process for updating the frequency bias parameters for passive correction for an SPS receiver.

FIG. 5 is a flow chart illustrating an exemplary process 500 for updating the frequency bias parameters for passive correction for the SPS receiver 308. This process may be part of the SPS frequency manager 316, and more specifically, be implemented in the Frequency Bias Estimation Determination (FBED) module 318.

In the aspect where tunable reference oscillator is used for SPS LO generation, this module may provide as outputs an updated SPS frequency bias estimate, tunable reference oscillator frequency control values associated with the bias estimate and time (e.g., time stamp) associated with these values, all stored in SPS frequency parameter table 317.

Initially, input parameters may be passed to this module (B502), which may include the current tunable reference oscillator frequency control value, a current frequency bias estimate, and the current time value (which may be, for example, a SPS Time Stamp, TS, which may be the number of seconds since 6 Jan. 1980). The tunable reference oscillator frequency control value may be a digital quantity (e.g., a 12-bit signed integer value), and the current frequency bias estimate can be a time varying quantity which may correspond to the current time value. A conditional operation may be performed to determine if the reference oscillator frequency control values and Frequency Bias values in SPS frequency parameter table (317) have been initialized (B504). If not, these parameters may be initialized with the input parameters (B528), and a counter may be incremented (B530). This counter may be termed the "confidence counter," and it can represent a measure of the quality of the current SPS frequency Bias estimate value. The higher the confidence counter value, the frequency bias estimate may be thought of as being more accurate. If it is determined in B504 that the parameters have been initialized, another conditional operation may be performed to determine whether the confidence counter is zero (B506). If so, the reference oscillator frequency control value and frequency bias estimate in SPS freq. parameter table may be initialized with the input parameters (B524), and the confidence counter may be incremented (B526).

If it is determined in B506 that the confidence counter was not zero, the FBED module 318 may adjust the current input frequency bias estimate, if it was not associated with the same tunable reference oscillator frequency control value as the current frequency bias estimate in SPS frequency parameter table 317, to properly account for the delta between the two when calculating new freq. bias; in addition the resulting frequency uncertainties should be enlarged to account for the associated errors in estimated tunable reference oscillator sensitivity.

Additionally, the age of the VCO may be taken into account when adjusting the input SPS frequency bias estimate in Block 508.

A sanity check may then be performed on the adjusted frequency bias values in a conditional operation (B510) to detect if the results are outside of an expected or acceptable range. If the parameters do not pass the sanity checks, the confidence counter may be decremented (B516), and another check may be performed to see if the confidence counter is zero (B518). If it is not zero, the SPS frequency parameters are not updated and the method 500 is finished. If the confidence counter is zero, the SPS freq. Parameter values are reset to the default values provided in the SPS freq. parameter table 317, and the method 500 is finished.

If in conditional Block 510 the adjusted parameters pass the sanity checks, the reference oscillator frequency control and bias estimates in SPS freq table (317) may be updated using the adjusted parameters. And the SPS time stamp associated with the reference oscillator parameters may also be passed as output. In various aspects, the reference oscillator bias estimate may be conditioned using a filter. This filter may be, for example, a simple one pole IIR filter having a gain of ¼. After updating the output values, the confidence counter may be incremented if it less than a maximum value (e.g., 255) (B514). The method 500 may then be done, storing the updated reference oscillator frequency control value and bias estimate), and the time (e.g., SPS time stamp) associated with these into SPS freq. parameter table (317).

In the aspect where free-running reference oscillator is used for SPS LO generation, the same flow chart may apply; except that now reference oscillator is a free-running and as such has no voltage control (e.g. free-running reference oscillator frequency control value may be set to 0 and does not change).

Figure 6:
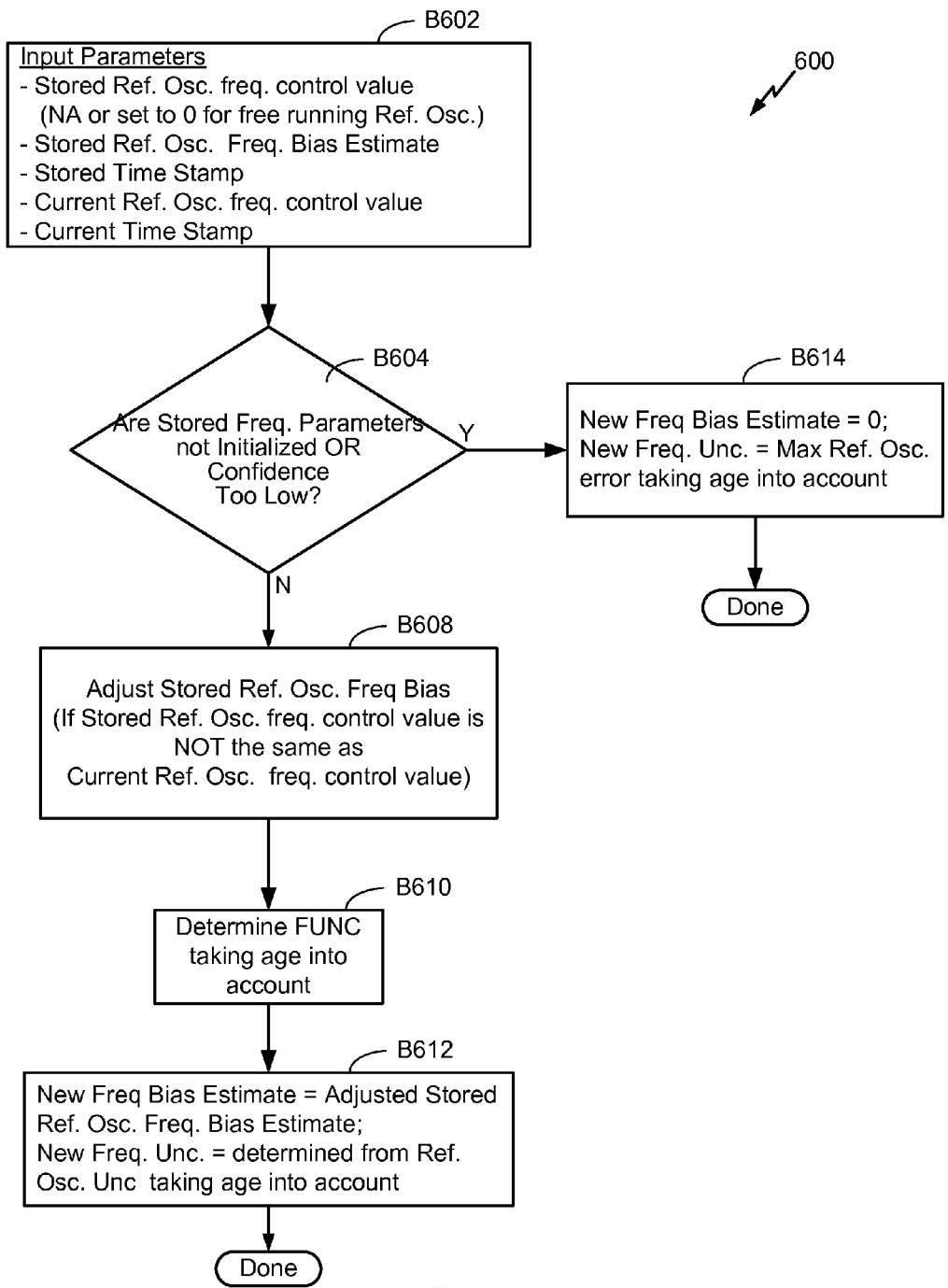
FIG. 6 is a flow chart illustrating an exemplary process for obtaining the frequency bias and determining its associated frequency uncertainty for passive correction for an SPS receiver.

FIG. 6 is a flow chart illustrating an exemplary process 600 for reading the stored frequency bias, stored reference oscillator frequency control value, and their stored associated time, as well as current reference oscillator frequency control value and the current time stamp, and determining an adjusted SPS frequency bias value and a corresponding frequency uncertainty. This process may be part of the SPS frequency manager 316, and more specifically, be implemented in the Frequency Bias Estimation Update (FBEU) module 320.

Initially, the FBEU module 320 may receive a latest stored reference oscillator frequency control value (set to 0 for free-running reference oscillator and does not change), a time associated with the stored reference oscillator frequency control value, and a corresponding stored reference oscillator frequency bias value, as well as current reference oscillator frequency control value, and a current time stamp (B602). These stored values may normally be based on a prior good SPS satellite fix, in which case they are from SPS freq. parameter Table (317) but may be associated with other technologies corresponding with the wireless communications system 304 if there was no good SPS satellite fix, or if they were of better quality (e.g. with lesser frequency uncertainty), in which case they are from Ref. Osc. Parameter Table (314).

A conditional operation may be performed to determine if the stored parameters (e.g. SPS freq. parameter table (317) and/or Ref. Osc. Parameter Table (314) was not initialized in the FBED module 318, or the confidence counter was below a threshold (B604). If this is true, the SPS frequency bias may be "adjusted" to zero, and the frequency uncertainty is set to the maximum reference oscillator error taking aging into account (B612).

If the Ref. Osc. Parameter Table (314) are determined of smaller uncertainty, they might be used. If not, and If it is determined in Block 604 that the SPS parameters were initialized in SPS freq. parameter table (317) and the confidence counter was not too low (i.e., the confidence in the SPS parameter estimates is sufficient), the frequency bias value determined in the FBED module 318 may be used and further adjusted (B608), if necessary. Afterward, the frequency uncertainty may be determined taking the age of the reference oscillator into account (B610).

In the aspect where tunable reference oscillator is used for the reference oscillator 306, if the new reference oscillator frequency control value (as input) is the same as the currently stored one in SPS frequency parameter table (317), then no bias adjustment may be necessary. If different, then the input reference oscillator frequency bias may be adjusted to account for the corresponding frequency differences. Moreover, the frequency uncertainty may be increased to account for the associated errors in the estimated reference oscillator sensitivity (B608). This step is not relevant in the aspect where free-running oscillator is used and may be skipped.

Figure 7:
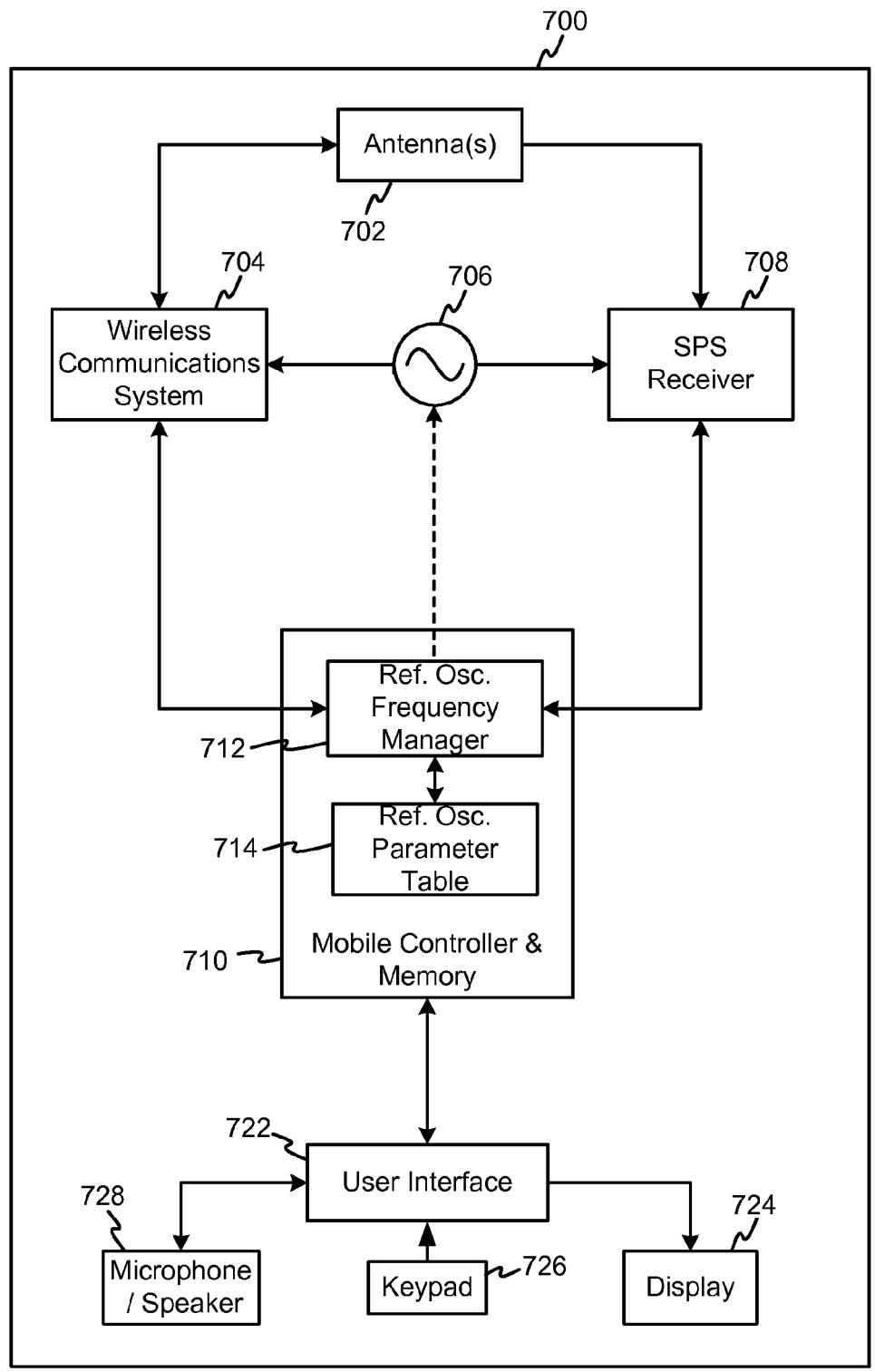
FIG. 7 is a block diagram of an exemplary wireless communications and position device which utilizes frequency bias correction for the entire wireless device.

FIG. 7 is a block diagram of an exemplary wireless communication and navigation device 700 that utilizes frequency bias correction for the entire device. The wireless device 700 may be any type of wireless device having position determination and/or navigation functionality, and may include, for example, cellular phones, smart phones, personal digital assistants, laptop computers, etc.

The wireless device 700 may include a wireless communication system 704 that may be connected to one or more antennas 702. The wireless communication system 704 comprises suitable devices, hardware, and/or software for communicating with and/or detecting signals to/from wireless base stations, and/or directly with other wireless devices. The wireless communications system may include transmitter/receiver modules which utilize an external reference oscillator 706 that enables accurate up-conversion/down-conversion (e.g., frequency translation) for the transmitted/received communication signals.

The wireless device 700 may include a user interface 722 which can include any suitable interface systems, such as a microphone/speaker 728, keypad 726, and display 724 that allow user interaction with the mobile device 700. The microphone/speaker 728 provides for voice communication services using the wireless communication system 704. The keypad 726 comprises any suitable buttons for user input. The display 724 comprises any suitable display, such as, for example, a backlit LCD display.

In one aspect, the wireless communication system 704 may comprise a CDMA communication system suitable for communicating with a CDMA network of wireless base stations however in other aspects, the wireless communication system may comprise another type of cellular telephony network, such as, for example, TDMA or GSM. Additionally, any other type of wireless networking technologies may be used, for example, Wi-Fi (802.11x), WiMax, etc.

A mobile control system (MC) 710 may be connected to the wireless communication system 704, and may include a microprocessor that provides standard processing functions, as well as other calculation and control functionality. The MC 710 may also include on-board memory for storing data and software instructions for executing programmed functionality within the wireless device 700. The MC 710 may further utilize external memory (not shown) for additional storage. The details of software functionality associated with aspects of the disclosure will be discussed in more detail below.

A position determination system may be provided within the wireless device 700. In one aspect, the position determination system may include an SPS receiver 708. The SPS receiver 708 may be connected to the one or more antennas 702, the MC 710, and the reference oscillator 706, and comprise any suitable hardware and/or software for receiving and processing SPS signals. The SPS receiver 708 requests information and operations as appropriate from the other systems, and performs the calculations necessary to determine the wireless device's position using measurements obtained by any suitable AFLT algorithm, SPS algorithm, or a combination of AFLT and SPS algorithms (A-SPS).

The SPS receiver 708 may utilize the same reference oscillator 706 for processing received SPS signals as is used for processing signals for the wireless communications system 704. Having a shared reference oscillator may provide the advantages of increased power efficiency and reduced cost of the wireless device 700. To accommodate each system on a board of a wireless device 700 which may have different frequency requirement, each system generates its own local oscillator (LO) signal at the required frequency, from the shared reference oscillator 706. As an example, for simultaneous reception of the SPS signal and reception/transmission of wireless communication signals, the SPS receiver 708 and the wireless communication system 704 may employ separate frequency synthesizers for generation of different frequency local oscillators signals (LOs), as required for each system.

The reference oscillator 706 may be a tunable reference oscillator, such as Voltage Controlled Crystal Oscillator (VCXO) or Voltage Controlled Temperature Compensated Crystal Oscillator (VCTCXO), where the frequency of oscillation may be controlled by a voltage, or, as in this aspect, a digital voltage control value. Undesirable variations in oscillation frequency due to temperature (and/or other error sources) may be compensated to improve accuracy. Such errors and their associated compensations are described in more detail below.

In another aspect, the reference oscillator 706 may be a free running local oscillator, such as Crystal Oscillator (XO) or Temperature Compensated Crystal Oscillator (TCXO). Undesirable variations in oscillation frequency due to temperature (and/or other error sources) may be compensated via corrections applied in each individual system on board of a wireless device, such as SPS receiver 708 and/or wireless communication system(s) 704, downstream from each system's LO, A software module and data tables may reside in memory and be utilized by the MC 710 in order to manage the errors and biases in the reference oscillator 706 when either the wireless communications system 704 or the SPS receiver 708 is initialized. Namely, a reference oscillator frequency manager 712 may be used to provide a variety of frequency bias estimates, which may be based upon the previous state of the system, the temperature, and/or the age of the reference oscillator. These estimates may typically have different accuracies, which may be measured in parts-per-million (ppm).

Both reference oscillator frequency errors and associated uncertainties can be stored in a reference oscillator parameter table 714. When the wireless communication or SPS system is initialized, the reference oscillator frequency manager 712 may select the frequency bias estimate which has the lowest associated error. This bias value may then be used to properly acquire, track and/or frequency translate signals for the wireless communication system and acquire, track and/or demodulate signals for SPS system.

The frequency bias values which are stored in the reference oscillator parameter table 714 may include hard coded defaults provided by manufacturers when the reference oscillator is made to specify the "goodness" of the reference oscillator used; values pushed to the device from the network provider (which may vary in accuracy depending upon the type of network, e.g., WCDMA, GSM, 1x/DO); values based upon the measured temperature and/or age of the reference oscillator, and values based upon a Recent Good System value (RGS) derived after the wireless communication system locks onto a provider's carrier frequency. The RGS value may be refined and stored because, during operation, the wireless communication system 704 may use frequency tracking loops to determine shifts in carrier frequency. This may address frequency errors due to reference oscillator biases and drifts. Newer values may be stored as the Recent Good System value in the reference oscillator parameter table 714.

In this aspect, during initialization of the SPS receiver, the reference oscillator Frequency Manager 712 provides reference oscillator freq. bias based on the best available information from all wireless systems (communication and SPS), thus reducing the time period to acquire the satellite. The stored XO frequency bias values(s) are used both during initialization of wireless communication system (704) to acquire/receive and transmit wireless communication signals, as well as during initialization of SPS receiver (708) for SPS signal acquisition.

Both wireless and SPS systems may benefit from each other's "knowledge" of the reference oscillator as both are allowed to use reference oscillator freq. manager 712 to both update and use reference oscillator freq. parameter table (714).

In the case when free-running oscillator is used for reference oscillator (706), the stored reference oscillator frequency bias value(s) are used in a "passive" manner, meaning that the frequency bias corrections may not be directly applied to adjust the free-running reference oscillator (706). Rather all reference oscillator corrections are applied elsewhere in each individual sub-system of the device for proper acquisition, tracking and/or modulation/demodulation of its signals. For example, the stored reference oscillator frequency bias value(s) are used to compute a center and a width for the window used to search for the SPS signal, as shown above in FIG. 3. The stored reference oscillator frequency bias value(s) may also be used to compute a center and a width for the window used to search for the wireless communication signal In the case where tunable oscillator is used for reference oscillator (706), the stored reference oscillator frequency bias value(s) are used in an "active" manner, meaning that the frequency bias corrections may be directly applied to adjust the tunable reference oscillator (706) rather than applying the corrections to adjust the center and width of the frequency search window in software. In this aspect, both the wireless communication system (704) and SPS receiver (708) derived tunable reference oscillator frequency parameters may be used directly to tune the tunable reference oscillator (706) so that both received SPS signal and received/transmitted wireless communications signals are accurately frequency translated (down-converted from its RF carrier to baseband in former and down-converted/up-converted in latter case).

The software and reference oscillator frequency bias value(s) may be stored in non-volatile memory which can be on-board the MC 710, however, in other aspects, this memory may reside on a separate chip package. In addition to the reference oscillator frequency bias estimate, other parameters such as the frequency uncertainty may be stored in the reference oscillator parameter table 714, for subsequent use by the XO Manager 710.

While only one wireless communication system 704 is shown in FIG. 7, one will appreciate that more than one wireless communication systems may be used in other aspects of the invention. For example, with multi-mode wireless devices, different wireless communication systems (e.g., CDMA, TDMA, Wi-Fi, etc.) may be present in the wireless device in order to access a variety of different networks. Depending upon the wireless device and the networks, these different wireless communication systems may operate separately from each other, or may operate simultaneously.

Moreover, while only one SPS 708 is shown in FIG. 7, one will appreciate that more than one SPS 708 may be used in the wireless device 700 in other aspects of the invention to perform location and/or navigation functionality.

Figure 8:
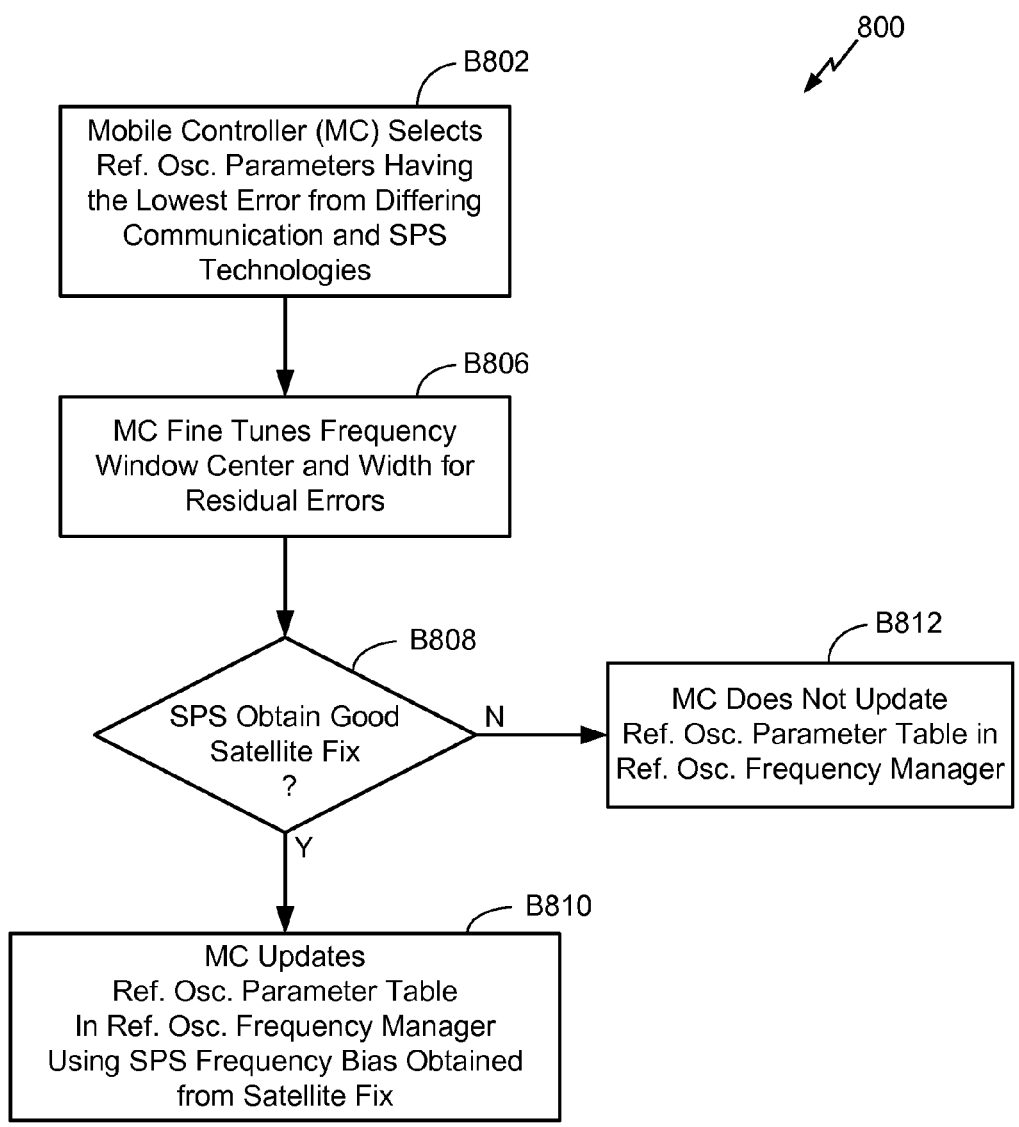
FIG. 8 is a top level flow chart illustrating an exemplary process for performing frequency bias correction for the entire wireless device

FIG. 8 is a top level flow chart illustrating an exemplary process 800 for performing passive frequency bias correction for SPS receiver. Initially, the method may start out by having the mobile controller (MC) 710 select reference oscillator parameters having the lowest error from the differing technologies (B802). These parameters include the frequency biases and uncertainties which may be stored in the reference oscillator parameter table 714. At this point, the frequency bias parameter may have originated using technologies associated with the wireless communication system 704, or the SPS receiver 708. Once the best frequency bias and uncertainty are read from the reference oscillator parameter table 714, the MC 706 may use these values to fine tune the center and width of the SPS frequency window which is used to search for the center frequency of the SPS signal (B806). These center and width of the search window are provided by the MC 310 to the SPS receiver 308 to assist in the initialization of the satellite acquisition processes. A determination may then be made to test whether the SPS receiver 708 obtains a good satellite fix (B808). If no satellite signal was acquired, then the MC 710 does not update the reference oscillator freq. bias values and/or uncertainties in the reference oscillator parameter table 714 (B812). If the SPS receiver 708 acquires a good satellite fix, then the MC 710 may update the reference oscillator frequency bias and/or uncertainty using the XO frequency manager 712 (B810).

Accordingly, because the frequency bias values are updated based upon the last good satellite fix, the aforementioned method may be defined as an adaptive technique for local oscillator management. This technique can enable the proper biasing of the initial SPS frequency search space and further reduce the initial SPS frequency uncertainties in the absence of any better XO manager information from any other wireless technology.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect of the invention can include a computer readable media embodying a method for managing a local oscillator in a wireless device having position determination functionality. Accordingly, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A method for managing a reference oscillator within a wireless device, comprising:
    selecting reference oscillator parameters associated with a lowest reference oscillator error, wherein the selection is based upon reference oscillator parameters derived using different technologies within the wireless device, wherein the reference oscillator comprises a tunable reference oscillator, and wherein the reference oscillator parameters include tunable reference oscillator parameters, a reference oscillator frequency control value, a reference oscillator frequency bias, a reference oscillator frequency bias uncertainty and a time at which the reference oscillator parameters were determined;
    acquiring a satellite based upon the selected reference oscillator parameters;
    calculating a satellite-based position fix;
    determining a quality of the satellite-based position fix, wherein the quality corresponds to an uncertainty associated with the selected reference oscillator parameters;
    updating the reference oscillator parameters based upon the quality of the satellite-based position fix;
    determining, as the tunable reference oscillator parameters, a frequency center and a width of a search window using the reference oscillator parameters;
    tuning the tunable reference oscillator using the determined tunable reference oscillator parameters;
    determining the reference oscillator parameters based upon the quality of the satellite-based position fix;
    storing the reference oscillator parameters when the wireless device successfully determines the satellite-based position fix;
    receiving a current reference oscillator frequency control value and a current reference oscillator frequency bias estimate;
    adjusting the received reference oscillator frequency bias estimate;
    performing sanity checks on the adjusted reference oscillator frequency bias estimate;
    determining reference oscillator parameters for storage based upon the adjusted reference oscillator frequency bias estimate; and
    incrementing a counter which represents a confidence in the determined reference oscillator parameters.

2. The method according to claim 1, further comprising:
    adjusting the received reference oscillator frequency bias estimate when the stored reference oscillator parameters have been determined and the confidence is sufficient; and
    determining a reference oscillator frequency uncertainty based upon an age of the reference oscillator.

3. The method of claim 2, further comprising:
    resetting the current reference oscillator frequency bias estimate to zero and the reference oscillator frequency uncertainty to a maximum value when the stored reference oscillator parameters have not been initialized or when the confidence is not sufficient.

4. A wireless device having position determination functionality which manages a reference oscillator using a plurality of technologies, comprising:
    means for selecting reference oscillator parameters associated with a lowest reference oscillator error, wherein the selection is based upon reference oscillator parameters derived using different technologies within the wireless device, wherein the reference oscillator comprises a tunable reference oscillator, and wherein the reference oscillator parameters include tunable reference oscillator parameters, a reference oscillator frequency control value, a reference oscillator frequency bias, a reference oscillator frequency bias uncertainty and a time at which the reference oscillator parameters were determined;
    means for acquiring a satellite based upon the selected reference oscillator parameters;
    means for calculating a satellite-based position fix;
    means for determining a quality of the satellite-based position fix, wherein the quality corresponds to an uncertainty associated with the selected reference oscillator parameters;
    means for updating the reference oscillator parameters based upon the quality of the satellite-based position fix;
    means for determining, as the tunable reference oscillator parameters, a frequency center and a width of a search window using the reference oscillator parameters;
    means for tuning the tunable reference oscillator using the determined tunable reference oscillator parameters;

means for determining the reference oscillator parameters based upon the quality of the satellite-based position fix;

means for storing the reference oscillator parameters when the wireless device successfully determines the satellite-based position fix;

means for receiving a current reference oscillator frequency control value and a current reference oscillator frequency bias estimate;

means for adjusting the received reference oscillator frequency bias estimate;

means for performing sanity checks on the adjusted reference oscillator frequency bias estimate;

means for determining reference oscillator parameters for storage based upon the adjusted reference oscillator frequency bias estimate; and means for incrementing a counter which represents a confidence in the determined reference oscillator parameters.

5. The wireless device according to claim 4, further comprising:

means for adjusting the received reference oscillator frequency bias estimate when the reference oscillator parameters have been determined and the confidence is sufficient; and means for determining a reference oscillator frequency uncertainty based upon an age of the reference oscillator.

6. The wireless device of claim 5, further comprising:

means for resetting the current reference oscillator frequency bias estimate to zero and the reference oscillator frequency uncertainty to a maximum value when the reference oscillator parameters have not been initialized or when the confidence is not sufficient.

7. A non-transitory computer readable medium comprising instructions for causing a processor to perform operations, comprising:

instructions to select reference oscillator parameters associated with a lowest reference oscillator error for a reference oscillator, wherein the selection is based upon reference oscillator parameters derived using different technologies within a wireless device, wherein the reference oscillator comprises a tunable reference oscillator, and wherein the reference oscillator parameters include tunable reference oscillator parameters, a reference oscillator frequency control value, a reference oscillator frequency bias, a reference oscillator frequency bias uncertainty and a time at which the reference oscillator parameters were determined;

instructions to acquire a satellite based upon the selected reference oscillator parameters;

instructions to calculate a satellite-based position fix;

instructions to determine the quality of the satellite-based position fix, wherein the quality corresponds to an uncertainty associated with the reference oscillator parameters;

instructions to update the reference oscillator parameters based upon the quality of the satellite-based position fix;

instructions to determine, as the tunable reference oscillator parameters, a frequency center and a width of a search window using the reference oscillator parameters;

instructions to tune the tunable reference oscillator using the determined tunable reference oscillator parameters;

instructions to determine the reference oscillator parameters based upon the quality of the satellite-based position fix;

instructions to store the reference oscillator parameters when the wireless device successfully determines the satellite-based position fix;

instructions to receive a current reference oscillator frequency control value and a current reference oscillator frequency bias estimate;

instructions to adjust the received reference oscillator frequency bias estimate;

instructions to perform sanity checks on the adjusted reference oscillator frequency bias estimate;

instructions to determine reference oscillator parameters for storage based upon the adjusted reference oscillator frequency bias estimate; and instructions to increment a counter which represents a confidence in the determined reference oscillator parameters.

8. The non-transitory computer readable medium according to claim 7, further comprising:

instructions to adjust the received reference oscillator frequency bias estimate when the reference oscillator parameters have been determined and the confidence is sufficient; and instructions to determine a reference oscillator frequency uncertainty based upon an age of the reference oscillator.

9. The non-transitory computer readable medium of claim 8, further comprising:

instructions to reset the current reference oscillator frequency bias estimate to zero and the reference oscillator frequency uncertainty to a maximum value when the reference oscillator parameters have not been initialized or when the confidence is not sufficient.

10. An apparatus, comprising:

a memory; and a processor coupled to the memory, the processor comprising:

logic configured to select reference oscillator parameters associated with a lowest reference oscillator error for a reference oscillator, wherein the selection is based upon reference oscillator parameters derived using different technologies within a wireless device, wherein the reference oscillator comprises a tunable reference oscillator, and wherein the reference oscillator parameters include tunable reference oscillator parameters, a reference oscillator frequency control value, a reference oscillator frequency bias, a reference oscillator frequency bias uncertainty and a time at which the reference oscillator parameters were determined;

logic configured to acquire a satellite based upon the selected reference oscillator parameters;

logic configured to calculate a satellite-based position fix;

logic configured to determine the quality of the satellite-based position fix, wherein the quality corresponds to an uncertainty associated with the reference oscillator parameters;

logic configured to update the reference oscillator parameters based upon the quality of the satellite-based position fix;

logic configured to determine, as the tunable reference oscillator parameters, a frequency center and a width of a search window using the reference oscillator parameters;

logic configured to tune the tunable reference oscillator using the determined tunable reference oscillator parameters;

logic configured to determine the reference oscillator parameters based upon the quality of the satellite-based position fix;

logic configured to store the reference oscillator parameters when the wireless device successfully determines the satellite-based position fix;

logic configured to receive a current reference oscillator frequency control value and a current reference oscillator frequency bias estimate;

logic configured to adjust the received reference oscillator frequency bias estimate;

logic configured to perform sanity checks on the adjusted reference oscillator frequency bias estimate;

logic configured to determine reference oscillator parameters for storage based upon the adjusted reference oscillator frequency bias estimate; and logic configured to increment a counter which represents a confidence in the determined reference oscillator parameters.

11. The apparatus of claim 10, wherein the processor further comprises:

logic configured to adjust the received reference oscillator frequency bias estimate when the reference oscillator parameters have been determined and the confidence is sufficient; and logic configured to determine a reference oscillator frequency uncertainty based upon an age of the reference oscillator.

12. The apparatus of claim 11, wherein the processor further comprises:

logic configured to reset the current reference oscillator frequency bias estimate to zero and the reference oscillator frequency uncertainty to a maximum value when the reference oscillator parameters have not been initialized or when the confidence is not sufficient.

\* \* \* \* \*